(12) United States Patent
Ogawa et al.

(10) Patent No.: US 7,382,171 B2
(45) Date of Patent: Jun. 3, 2008

(54) SEMICONDUCTOR CIRCUIT FOR DETECTING A SIGNAL PROPAGATION TIME

(75) Inventors: Makoto Ogawa, Tokyo (JP); Tadashi Shibata, Tokyo (JP)

(73) Assignee: Rohm Co., Ltd., Kyoto (JP)

( * ) Notice: Subject to any disclaimer, the term of this patent is extended or adjusted under 35 U.S.C. 154(b) by 701 days.

(21) Appl. No.: 10/779,802

(22) Filed: Feb. 18, 2004

(65) Prior Publication Data

US 2004/0160255 A1    Aug. 19, 2004

(30) Foreign Application Priority Data

Feb. 18, 2003   (JP)   ............... 2003-039740

(51) Int. Cl.
*H03H 11/26*   (2006.01)
(52) U.S. Cl. ............................ 327/263; 327/293
(58) Field of Classification Search .............. None
See application file for complete search history.

(56) References Cited

U.S. PATENT DOCUMENTS

| | | | | |
|---|---|---|---|---|
| 5,646,568 A | * | 7/1997 | Sato | 327/276 |
| 6,340,901 B1 | * | 1/2002 | Molnar | 327/19 |
| 6,509,775 B2 | * | 1/2003 | Saeki | 327/271 |
| 7,036,098 B2 | * | 4/2006 | Eleyan et al. | 716/4 |

* cited by examiner

*Primary Examiner*—Cassandra Cox
(74) *Attorney, Agent, or Firm*—Kenyon & Kenyon LLP

(57) ABSTRACT

There is provided a semiconductor circuit including three or more nodes at least including one input node and one output node, plural paths which are connected between the three or more nodes and whose signal propagation directions between the nodes are regulated, a signal propagation time regulator for regulating a signal propagation time of each of the paths, an input unit for inputting a predetermined input signal to the input node, and a detector for detecting a time required for the input signal to propagate through the paths and arrive at the output node.

15 Claims, 16 Drawing Sheets

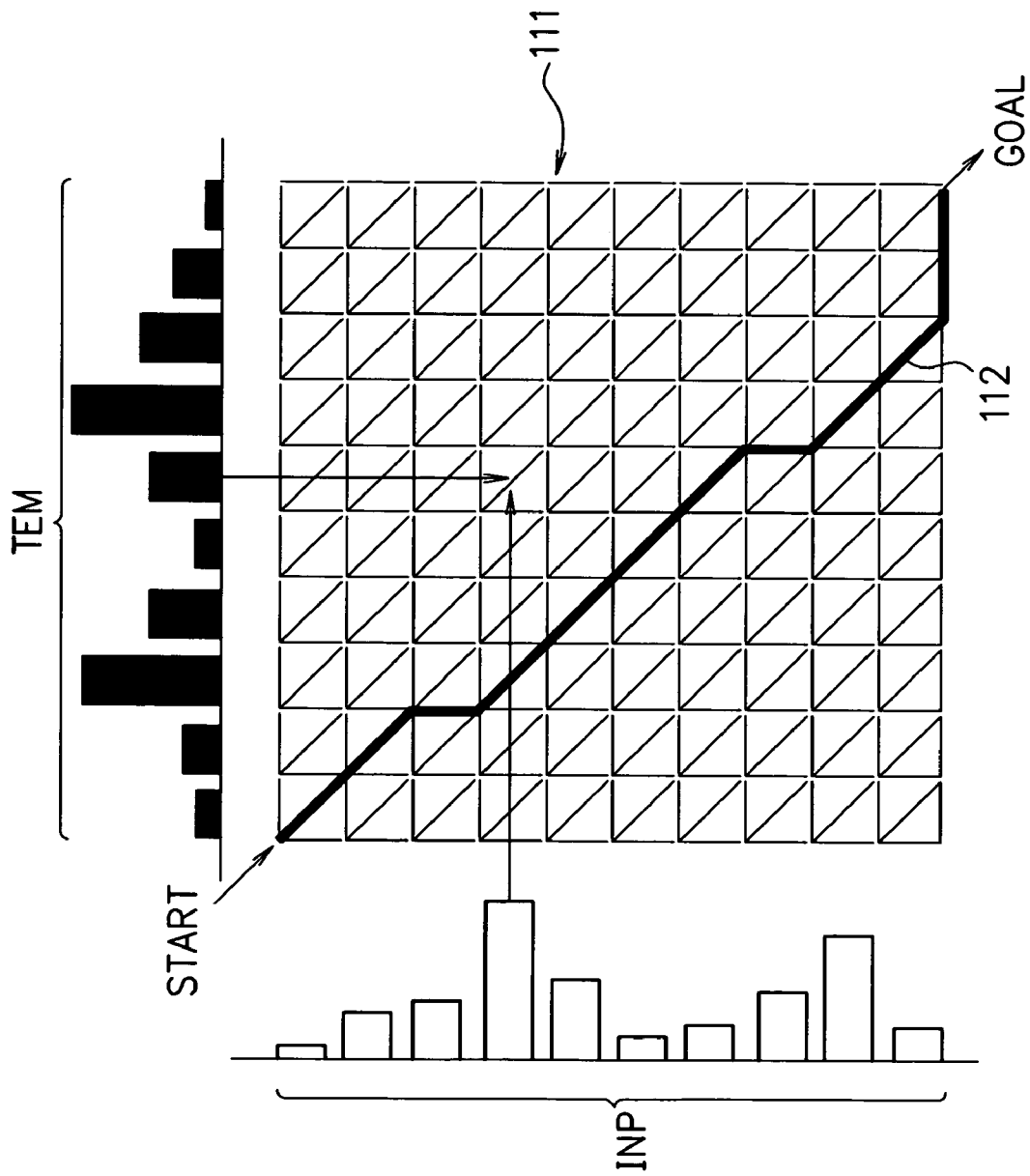

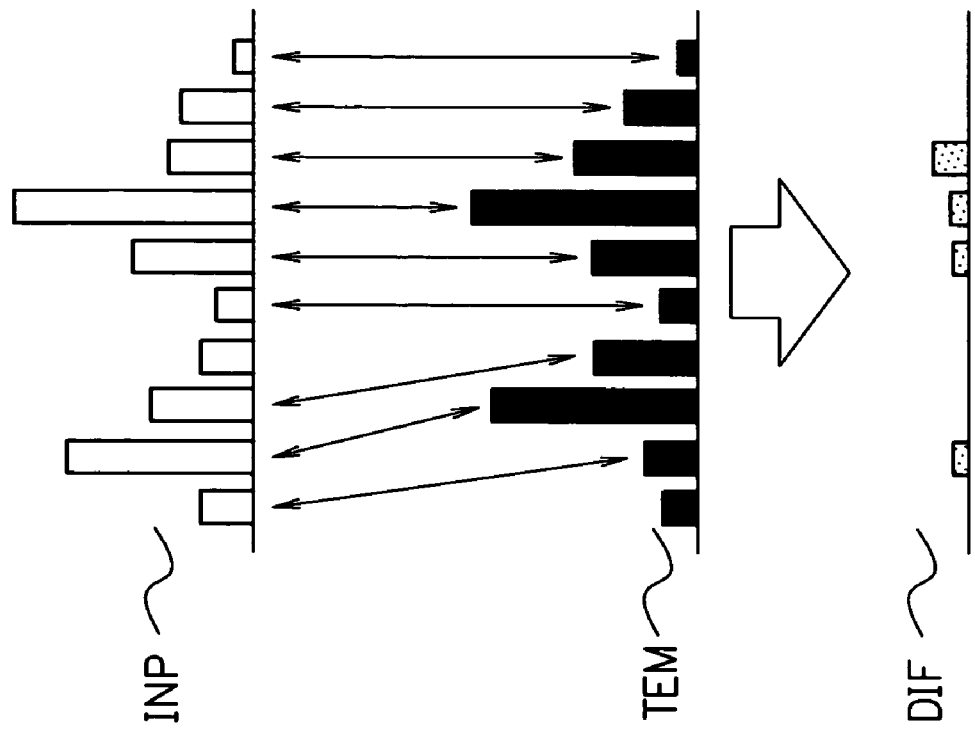
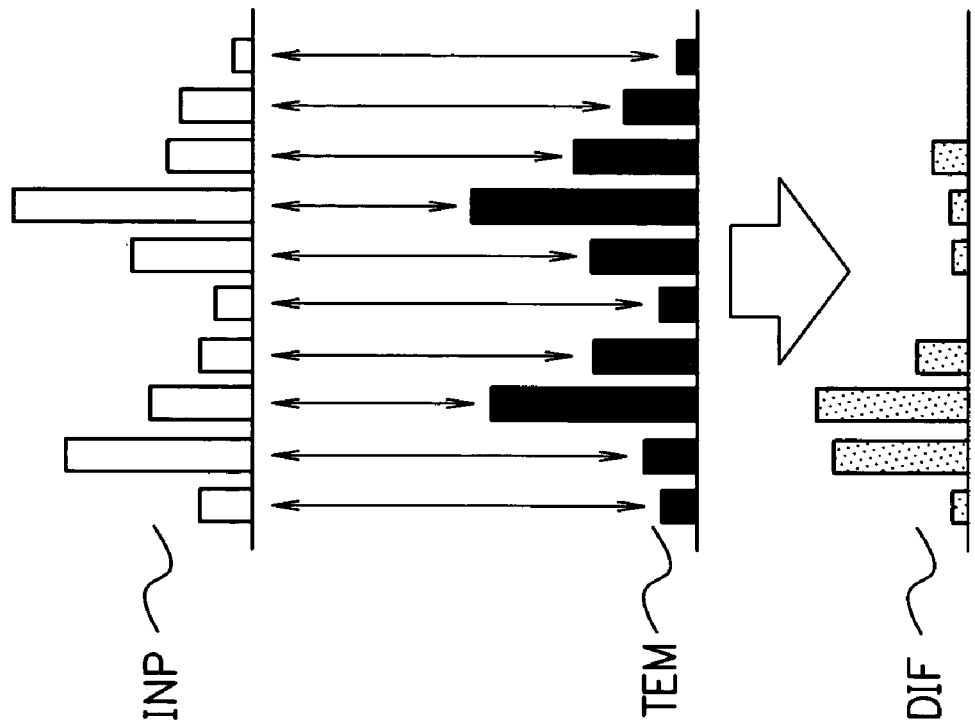

F I G. 4
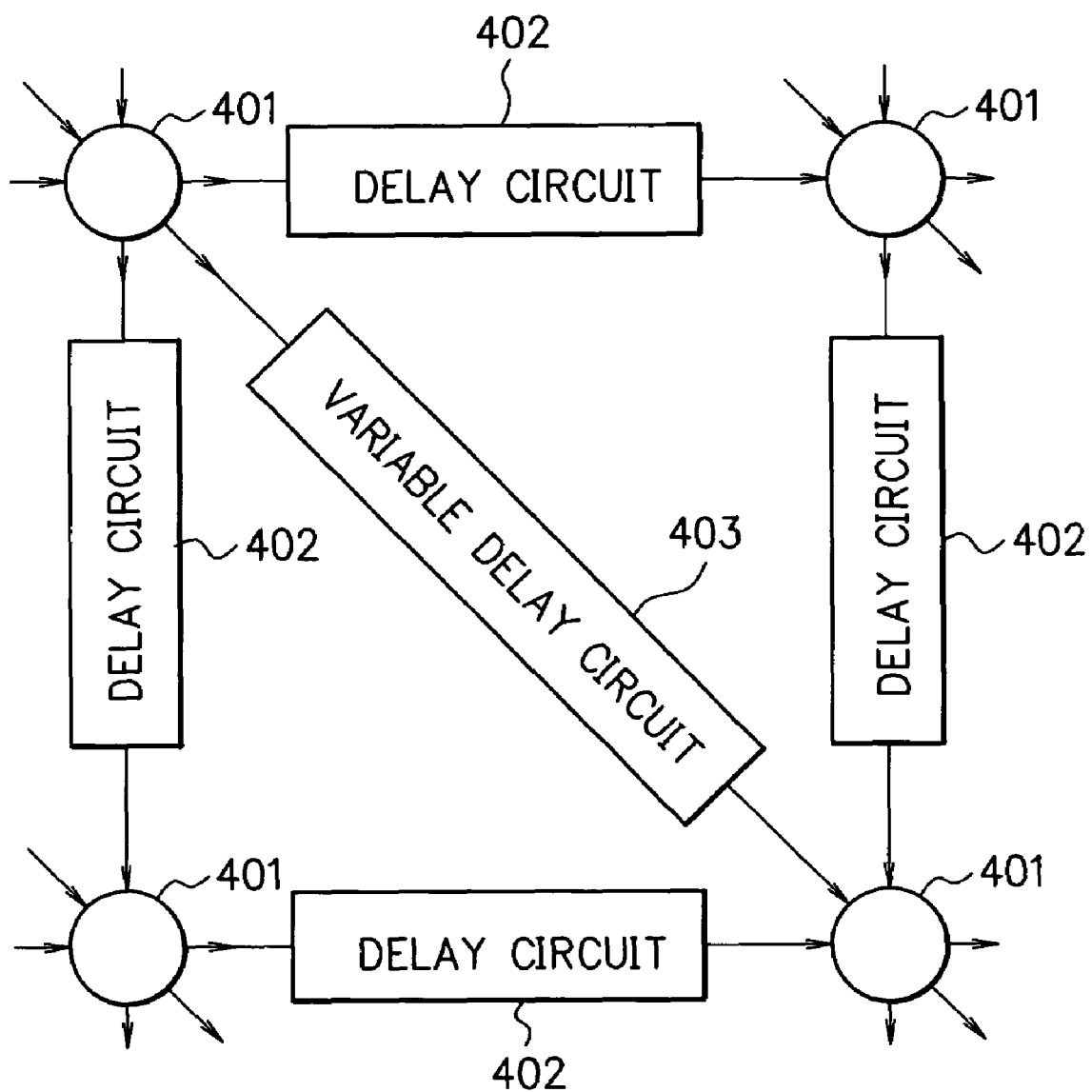

F I G. 5
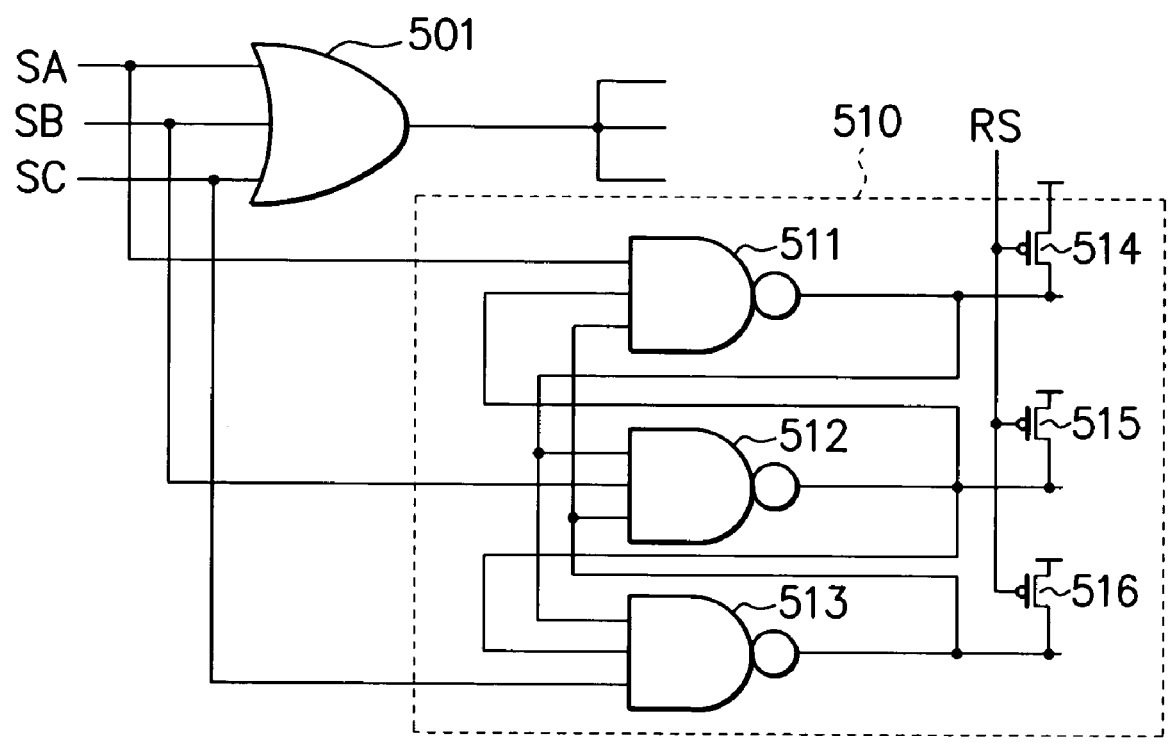

SEMICONDUCTOR CIRCUIT FOR DETECTING A SIGNAL PROPAGATION TIME

CROSS-REFERENCE TO RELATED APPLICATIONS

This application is based upon and claims the benefit of priority from the prior Japanese Patent Application No. 2003-039740, filed on Feb. 18, 2003, the entire contents of which are incorporated herein by reference.

BACKGROUND OF THE INVENTION

1. Field of the Invention

The present invention relates to a semiconductor circuit, and particularly relates to a semiconductor circuit for detecting a signal propagation time.

2. Description of the Related Art

FIG. 2A shows a normal vector matching algorithm. In matching, how much an input pattern INP is similar to a template pattern TEM is detected. For example, the vertical axis of each of the input pattern, INP and the template pattern TEM shows a voice data value, and the horizontal axis thereof shows a time. In this normal vector matching, a difference DIF between the input pattern INP and the template pattern TEM is found with respect to each of corresponding horizontal axis values. The difference DIF is represented by an absolute value of a difference between both the patterns. It can be said that the smaller the difference DIF, the more similar the input pattern INP and the template pattern TEM are to each other.

On this occasion, in the input pattern INP, the number of data often increases or decreases somewhat with respect to the horizontal axis. In other words, data on some time axis is missing or data is inserted in some cases. Also in this case, a human being judges the degree of similarity by whether or not overall patterns of the input pattern INP and the template pattern TEM are similar to each other.

In this normal vector matching, however, if the number of data in the input pattern INP increases or decreases by even only one with respect to the horizontal axis, a correspondence between the horizontal axes of both the patterns cannot be obtained, and consequently the degree of similarity between both the patterns extremely reduces. Hence, an algorithm in FIG. 2B is devised.

FIG. 2B shows a DP (dynamic programming) matching algorithm. In DP matching, when the input pattern INP and the template pattern TEM are compared, a comparison is made without a correspondence between the horizontal axes being strictly regulated. Namely, the input pattern INP and the template pattern TEM are compared in a state where they are made movable in a horizontal axis direction. Consequently, the difference DIF between both the patterns reduces. In other words, even in the case where the difference DIF increases in the normal vector matching in FIG. 2A, the difference DIF reduces in the DP matching in FIG. 2B, which enables proper matching.

In DP matching, the input pattern INP and the template pattern TEM are compared in the state where the horizontal axes thereof are made movable, whereby there exist numerous comparison combinations. The difference DIF between the most similar combination among the comparison combinations is found. To realize this, many combinations need to be compared, which requires enormous processing time.

SUMMARY OF THE INVENTION

An object of the present invention is to provide a semiconductor circuit capable of performing DP matching at high speed.

A semiconductor circuit of the present invention comprises: three or more nodes at least including one input node and one output node; plural paths which are connected between the three or more nodes and whose signal propagation directions between the nodes are regulated; a signal propagation time regulator for regulating a signal propagation time of each of the paths; an input unit for inputting a predetermined input signal to the input node; and a detector for detecting a time required for the input signal to propagate through the paths and arrive at the output node.

According to the present invention, it is possible to regulate the signal propagation time of each of the paths and detect the time required for the input signal to propagate through the paths and arrive at the output node. If the signal propagation time of each path is regulated according to the degree of coincidence or the degree of similarity between two signals to be subjected to matching, the degree of coincidence or the degree of similarity between these two signals can be detected according to the time required to arrive at the output node. Moreover, if a shortest path or a longest path of the signal is detected, a comparison combination of the shortest path or the longest path corresponding to the degree of coincidence or the degree of similarity can be detected.

BRIEF DESCRIPTION OF THE DRAWINGS

FIG. 1 is a diagram showing a shortest path detecting method for performing DP matching according to an embodiment of the present invention;

FIG. 2A is a diagram showing a normal vector matching algorithm, and FIG. 2B is a diagram showing a DP matching algorithm;

FIG. 4 is a diagram showing the configuration of a semiconductor circuit of each square of a lattice;

FIG. 5 is a diagram showing a configuration example of a node circuit;

DETAILED DESCRIPTION OF THE PREFERRED EMBODIMENTS

FIG. 1 shows a shortest path detecting method for performing DP (dynamic programming) matching according to an embodiment of the present invention. DP matching between an input pattern INP and a template pattern TEM is performed to detect a comparison combination in which both the patterns are the most similar to each other as a shortest path 112. Comparison combinations of the input pattern INP and the template pattern TEM are represented by a two-dimensional lattice-shaped path group 111. Squares of a lattice are paths each to compare one element data in the input pattern INP and one element data in the template pattern TEM. The distance is short when the degree of similarity between both the patterns is high, whereas the distance is long when the degree of similarly between them is low. A junction point of respective squares of the lattice is taken as a node. An input signal is inputted to a start node (input node) START, and a signal outputted to a goal node (output node) GOAL is detected. The input signal arrives at the goal node GOAL via plural combinations of paths. A signal which goes via the shortest path 112 arrives at the goal node GOAL first. This shortest path 112 shows a comparison combination with the highest degree of similarity. The time required for the signal to arrive at the goal node GOAL first via the shortest path 112 shows the degree of similarity. The shorter the-propagation time, the higher the degree of similarity becomes. A more specific explanation will be given below.

Figure 3:
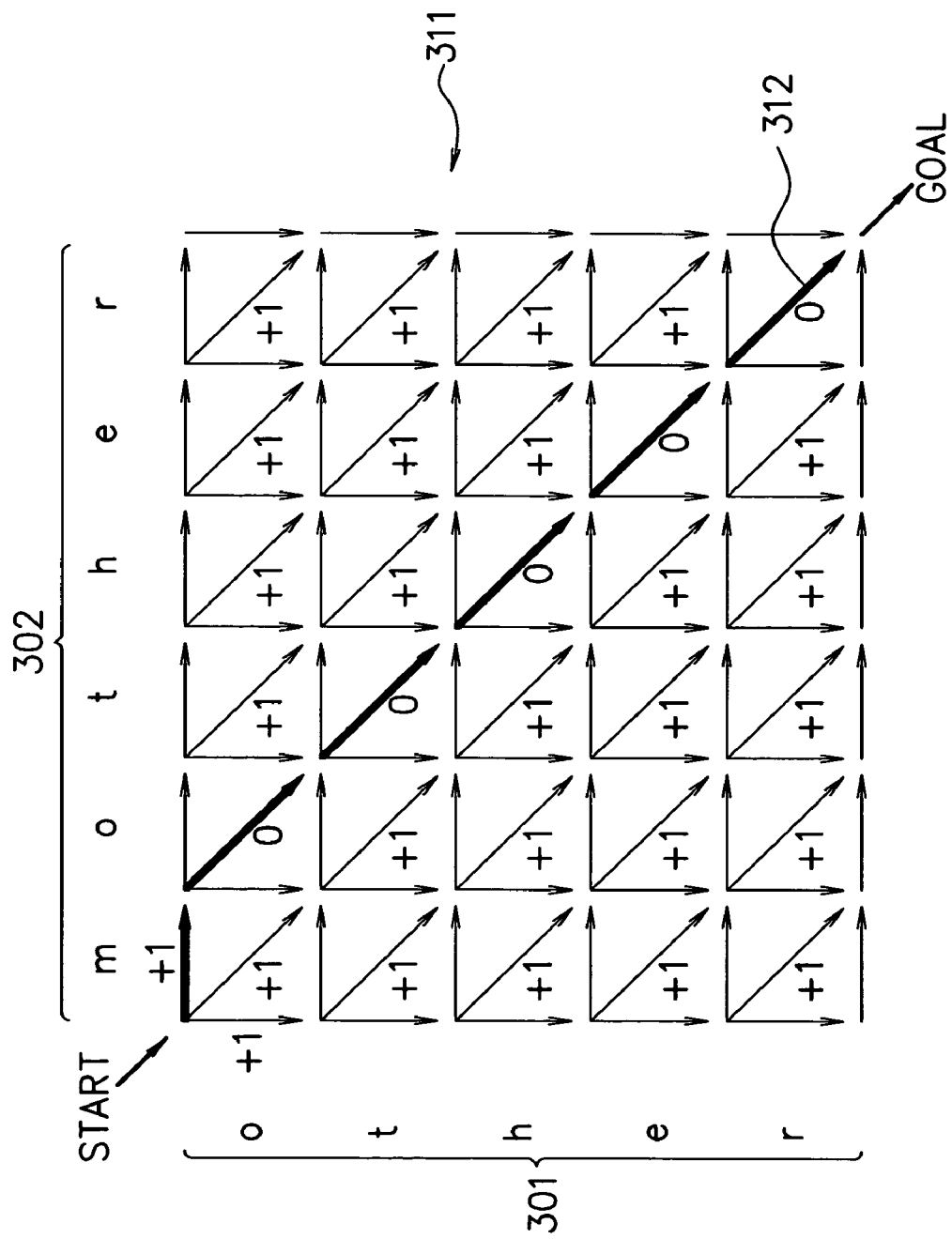
FIG. 3 is a diagram showing the specific shortest path detecting method.

FIG. 3 is a diagram showing the more specific shortest path detecting method. An input pattern 301 is, for example, a character string "other". A template pattern 302 is, for example a character string "mother". An example in which matching between these two character strings is performed will be explained. Comparison combinations of the input pattern 301 and the template pattern 302 are represented by a two-dimensional lattice-shaped path group 311. Squares of a lattice are paths each to compare one character in the input pattern 301 and one character in the template pattern 302. For example, the distance when both the characters coincide is taken as "0" and the distance when both the characters do not coincide is taken as "+1". Each square of the lattice has a first path shown by a rightward arrow, a second path shown by a downward arrow, and a third path shown by a right-downward arrow. By inputting the input signal to the start node START, the signal propagation is started from the start node START.

First, a right-downward path of the start node START will be explained. The right-downward path indicates a path which shifts the input pattern 301 and the template pattern 302 respectively by one character. Namely, at the start node START, "o" of the input pattern 301 and "m" of the template pattern 302 are compared. Since these two do not coincide, the distance is "+1", and through the right-downward path, "t" of the input pattern 301 and "o" of the template pattern 302 will be compared next.

Next, a downward path of the start node START will be explained. The downward path indicates a path which shifts only the input pattern 301 by one character without shifting the template pattern 302. Namely, at the start node START, the input pattern 301 is shifted by one character without a comparison between "o" of the input pattern 301 and "m" of the template pattern 302 being made. Since the comparison is not made, the distance is "+1", and through the downward path, "t" of the input pattern 301 and "m" of the template pattern 302 will be compared next. In other words, regarding the template pattern 302, a gap to compare the same character with the next character in the input pattern 301 without making a comparison is provided. If this gap is represented as "_", the objects to be compared of this path are "ot" of the input pattern 301 and "_m" of the template pattern 302.

Then, a rightward path of the start node START will be explained. The rightward path indicates a path which shifts only the template pattern 302 by one character without shifting the input pattern 301. Namely, at the start node START, the template pattern 302 is shifted by one character without a comparison between "o" of the input pattern 301 and "m" of the template pattern 302 being made. Since the comparison is not made, the distance is "+1", and through the rightward path, "o" of the input pattern 301 and "o" of the template pattern 302 will be compared next. In other words, regarding the input pattern 301, a gap is provided, and hence the objects to be compared of this path are "_o" of the input pattern 301 and "mo" of the template pattern 302. A shortest path 312 following this will be explained below.

Thereafter, "o" of the input pattern 301 and "o" of the template pattern 302 are compared, and since these two coincide, the distance is set at "0" and the comparison proceeds to a right-downward path. Then, "ther" of the input pattern 301 and "ther" of the template pattern 302 are compared in sequence in the same manner, and since these two coincide in each comparison, the distance is set at "0" and the comparison proceeds to a right-downward path. This path, as the shortest path 312, arrives at the goal node GOAL in the shortest distance. The total distance of the shortest path 312 is "+1", which corresponds to the degree of similarity (degree of dissimilarity).

A longitudinal path here corresponds to a gap of the template pattern 302, whereby the distance of every longitudinal path is "+1". Moreover, a lateral path corresponds to a gap of the input pattern 301, whereby the distance of every lateral path is also "+1". In contrast to this, regarding the right-downward path, the distance is "0" when both characters coincide, while the distance is "+1" when both the characters do not coincide. Namely, the distance of the right-downward path changes depending on the degree of coincidence between both characters.

FIG. 4 shows the configuration of a semiconductor circuit of each square of the lattice described above. A node circuit 401 is provided at a node being a junction point of respective paths. The node circuit 401 includes, for example, a three-input three-output logical add (OR) circuit. In this lattice square circuit, the aforementioned distance is represented as a delay time. The distance of "+1" of each of the downward path and the rightward path is represented as a delay time of a delay circuit 402. The distance of the right-downward path is represented as a delay time of a variable delay circuit 403. The delay time of the variable delay circuit changes according to the degree of coincidence between both characters. The longer the distance, the longer the delay time becomes.

FIG. 5 shows a configuration example of the node circuit 401 in FIG. 4. The node circuit 401 includes a three-input OR circuit 501 and a shortest path storage circuit 510. The OR circuit 501, to which, for example, three signals SA, SB, and SC inputted from three paths are inputted, outputs a logical sum thereof to other three nodes.

The shortest path storage circuit 510 includes three three-input negative logical product (NAND) circuits 511 to 513 and p-channel MOS transistors 514 to 516. The NAND circuit 511, to which the signal SA is inputted and output signals of the NAND circuits 512 and 513 are inputted, outputs a negative logical product thereof. The NAND circuit 512, to which the signal SB is inputted and output signals of the NAND circuits 511 and 513 are inputted, outputs a negative logical product thereof. The NAND circuit 513, to which the signal SC is inputted and output signals of the NAND circuits 511 and 512 are inputted, outputs a negative logical product thereof. In other words, to each of the NAND circuits, one each of the three signals SA, SB, and SC inputted via three paths is inputted, and outputs of the other two NAND circuits are inputted.

The shortest path storage circuit 510 specifies and stores a path of a signal, which has arrived first, out of the three signals SA, SB, and SC. The input signal of the start node START is low before the detection of the shortest path, and the input signal is driven high during the detection of the shortest path. When the input signal is low, all the signals SA, SB, and SC are low. As a result, each of the three NAND circuits 511 to 513 outputs a high level.

Then, when the high-level input signal is inputted to the start node START, the three signals SA, SB, and SC go high with predetermined delay times. The shortest path storage circuit 510 can store a path of a signal, which has gone high first, out of the three signals SA, SB, and SC.

For example, it is assumed that the signal SA goes high first and that the other signals SB and SC still remain low. In this case, the NAND circuit 511 outputs a low level, and the NAND circuits 512 and 513 maintain high-level outputs. After this, even if the signals SB and SC change to a high level, the shortest path storage circuit 510 maintains this state and continues storage. Namely, an output of the NAND circuit 511 as a low-level output is inputted to the other NAND circuit 512 and 513, whereby even if the signals SB and SC are driven high later, each of the NAND circuits 512 and 513 continues outputting a high level.

In the shortest path storage circuit 510, any one of the three NAND circuits 511 to 513 outputs a low level. By checking which one of the outputs of the NAND circuits is low, a path of a signal, which has arrived first, out of the three signals SA, SB, and SC can be found. It can be known that if the output of NAND circuit 511 is low, the signal SA has arrived first, if the output of the NAND circuit 512 is low, the signal SB has arrived first, and that if the output of the NAND circuit 513 is low, the signal SC has arrived first. By using this shortest path storage circuit 510, it is possible to detect the shortest path 312 in FIG. 3 by tracing back the path from the goal node GOAL. Namely, the shortest path can be found by tracing back the path stored in the shortest path storage circuit 510.

Gates of transistors 514 to 516 are connected to a reset signal RS, sources thereof are respectively connected to power source potentials, and drains thereof are respectively connected to output terminals of the NAND circuits 511, 512, and 513. Before the detection of the shortest path, the input signal of the start node START is driven low (the signals SA, SB, and SC are driven low) and the reset signal RS is driven low to turn on the transistors 514 to 516. The outputs of the NAND circuits 511 to 513 are connected to the power source potentials and reset high. During the detection of the shortest path, the reset signal is driven high to turn off the transistors 514 to 516. Incidentally, it is also possible to reset the outputs of the NAND circuits 511 to 513 high by eliminating the transistors 514 to 516 and driving the input signal of the start node START low (driving the signals SA, SB, and SC low).

Note that although the configuration of the three-input three-output node circuit 401 is explained in FIG. 5, but a one-input or two-input node circuit can be configured in the same manner.

Figure 6A:
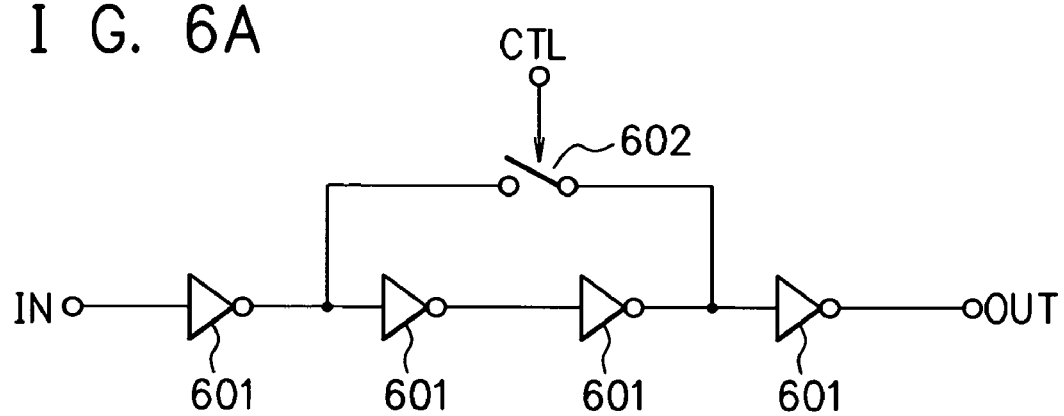
FIG. 6A is a diagram showing a configuration example of a variable delay circuit.

FIG. 6A shows a configuration example of the variable delay circuit 403 in FIG. 4. In the variable delay circuit 403, an even number (for example, four) of inverters 601 are connected in series, and a signal inputted to an input terminal IN is outputted from an output terminal OUT with a delay. Each of the inverters 601 outputs a logical negation signal with a predetermined delay time. A switch 602 bypasses an even number (for example, two) of inverters 601 to establish a short circuit in response to a control signal CTL. The control signal CTL closes the switch 602 if both characters coincide, and opens the switch 602 if both the characters do not coincide. In other words, if both the characters do not coincide, the signal is outputted from the output terminal OUT with a delay time corresponding to four inverters 601 being added thereto. If both the characters coincide, the signal is outputted from the output terminal OUT with a delay time corresponding to two inverters 601 being added thereto.

Figure 6B:
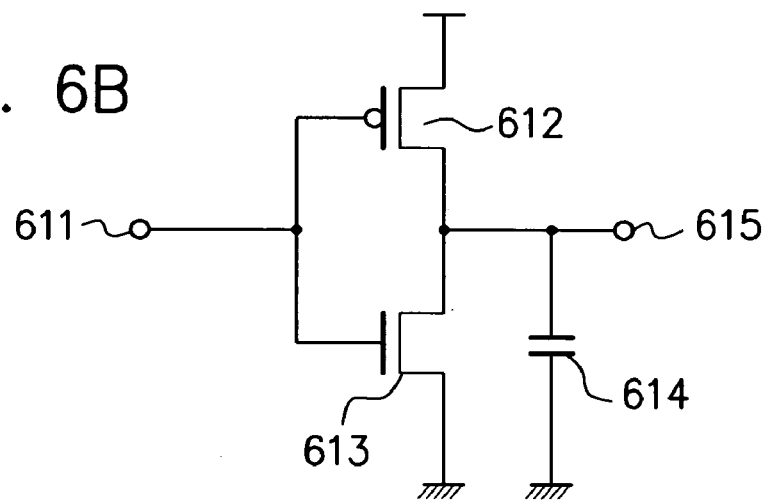
FIG. 6B is a diagram showing a configuration example of an inverter.

FIG. 6B shows a configuration example of each of the aforementioned inverters 601. A gate of a p-channel MOS transistor 612 is connected to an input terminal 611, a source thereof is connected to a power source potential, and a drain thereof is connected to an output terminal 615. A gate of an n-channel MOS transistor 613 is connected to the input terminal 611, a source thereof is connected to a ground potential, and a drain thereof is connected to the output terminal 615. A capacitance 614 is connected between the output terminal 615 and a ground potential. This inverter adds a predetermined delay time to a signal inputted to the input terminal 611 and outputs a logical negation signal thereof from the output terminal 615.

Figure 6C:
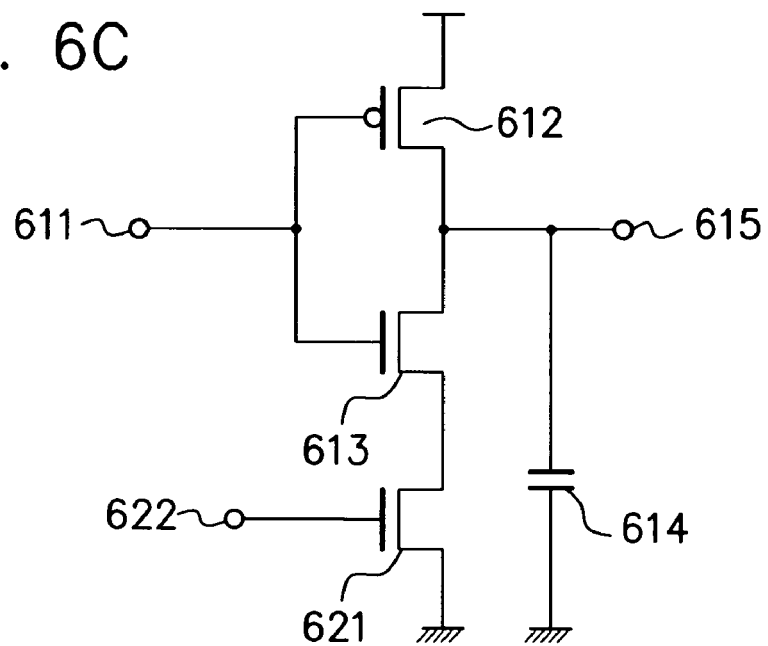
FIG. 6C is a diagram showing another configuration example of the variable delay circuit.

FIG. 6C shows another configuration example of the variable delay circuit 403 in FIG. 4. This variable delay circuit 403 is obtained by adding an n-channel MOS transistor 621 to the inverter in FIG. 6B. A gate of the transistor 621 is connected to a control terminal 622, a source thereof is connected to the ground terminal, and a drain thereof is connected to the source of the transistor 613. Inputted to the control terminal 622 is a control voltage which increases according to the degree of coincidence between both characters. The higher the voltage of the control terminal 622, the shorter the delay time becomes.

Incidentally, the delay circuit 402 in FIG. 4 can be also configured so that the delay time is fixed as above.

Figure 7:
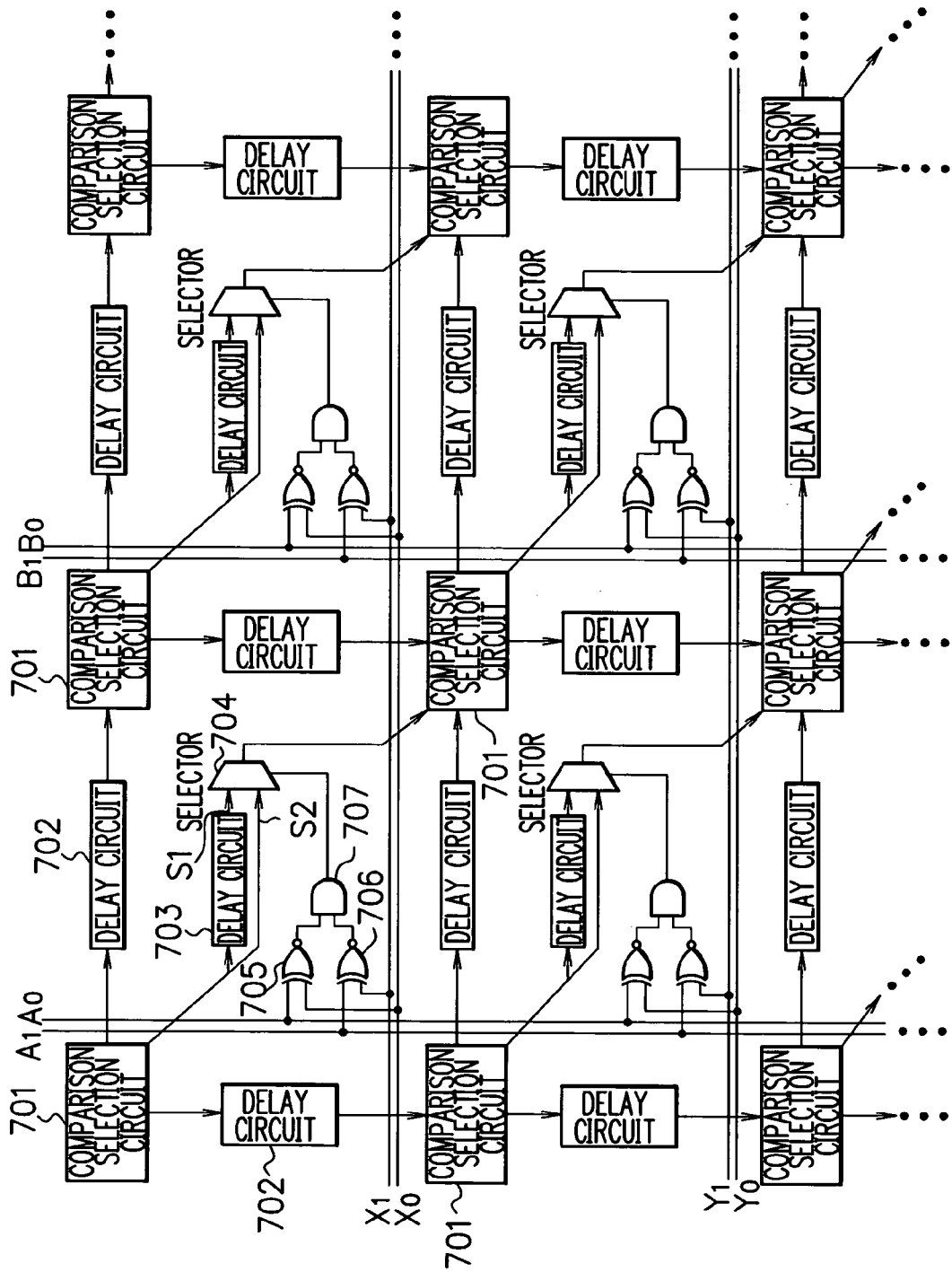
FIG. 7 is a diagram showing a more specific configuration example of the lattice square circuit.

FIG. 7 shows a more specific configuration example of the lattice square circuit in FIG. 4. A comparison selection circuit 701 corresponds to the node circuit 401 in FIG. 4. A delay circuit 702 corresponds to the delay circuit 402 in FIG. 4. A delay circuit 703 and a selector 704 correspond to the variable delay circuit 403 in FIG. 4.

Each lattice square circuit compares, for example, one character of the input pattern and one character of the template pattern as described above. One alphabetic character is normally represented as a 7-bit or 8-bit character code, and hence the character codes are compared. In FIG. 7, to simplify the explanation, an example in which one character is represented by two bits will be explained.

The upper left lattice square circuit compares a 2-bit code X1, X0 (for example, "o" in FIG. 3) of the input pattern and a 2-bit code A1, A0 (for example, "m" in FIG. 3) of the template pattern. The upper right lattice square circuit compares a 2-bit code X1, X0 (for example, "o" in FIG. 3) of the input pattern and a 2-bit code B1, B0 (for example, "o" in FIG. 3) of the template pattern. The lower left lattice square circuit compares a 2-bit code Y1, Y0 (for example, "t" in FIG. 3) of the input pattern and a 2-bit code A1, A0 (for example, "m" in FIG. 3) of the template pattern. The lower right lattice square circuit compares a 2-bit code Y1, Y0 (for example, "t" in FIG. 3) of the input pattern and a 2-bit code B1, B0 (for example, "o" in FIG. 3) of the template pattern.

Next, an operation example of the upper left lattice square circuit will be explained. An exclusive negative logical sum (XNOR) circuit 705 computes and outputs an XNOR of a 1-bit signal X0 and a 1-bit signal A0. An XNOR circuit 706 computes and outputs an XNOR of a 1-bit signal X1 and a 1-bit signal A1. Each of the XNOR circuits 705 and 706 outputs a high level (logical value "1") if two input signals are the same signal, and outputs a low level (logical value "0") if the two input signals are different signals. A logical product (AND) circuit 707 computes and outputs a logical product of outputs of the XNOR circuits 705 and 706. The AND circuit 707 is a logical circuit which outputs a high level when both of two input signals are high.

The selector 704 outputs a signal S2 to the lower right comparison selection circuit 701 when the output of the AND circuit 707 is high, and outputs a signal S1 to the lower right comparison selection circuit 701 when the output of the AND circuit 707 is low. The signal S1 is a signal obtained by delaying an output signal of the upper left comparison selection circuit 701 by the delay circuit 703. The signal S2 is the output signal itself of the upper left comparison selection circuit 701. Namely, if the 2-bit code X1, X0 of the input pattern and the 2-bit code A1, A0 of the template pattern do not coincide, the selector 704 outputs the delayed signal S1, and if they coincide, the selector 704 outputs the undelayed signal S2.

As in the case of a path for the aforementioned signal S2, it is not always necessary to provide a delay circuit in a path which connects nodes. A means for adjusting the signal propagation time is only required.

Figure 8:
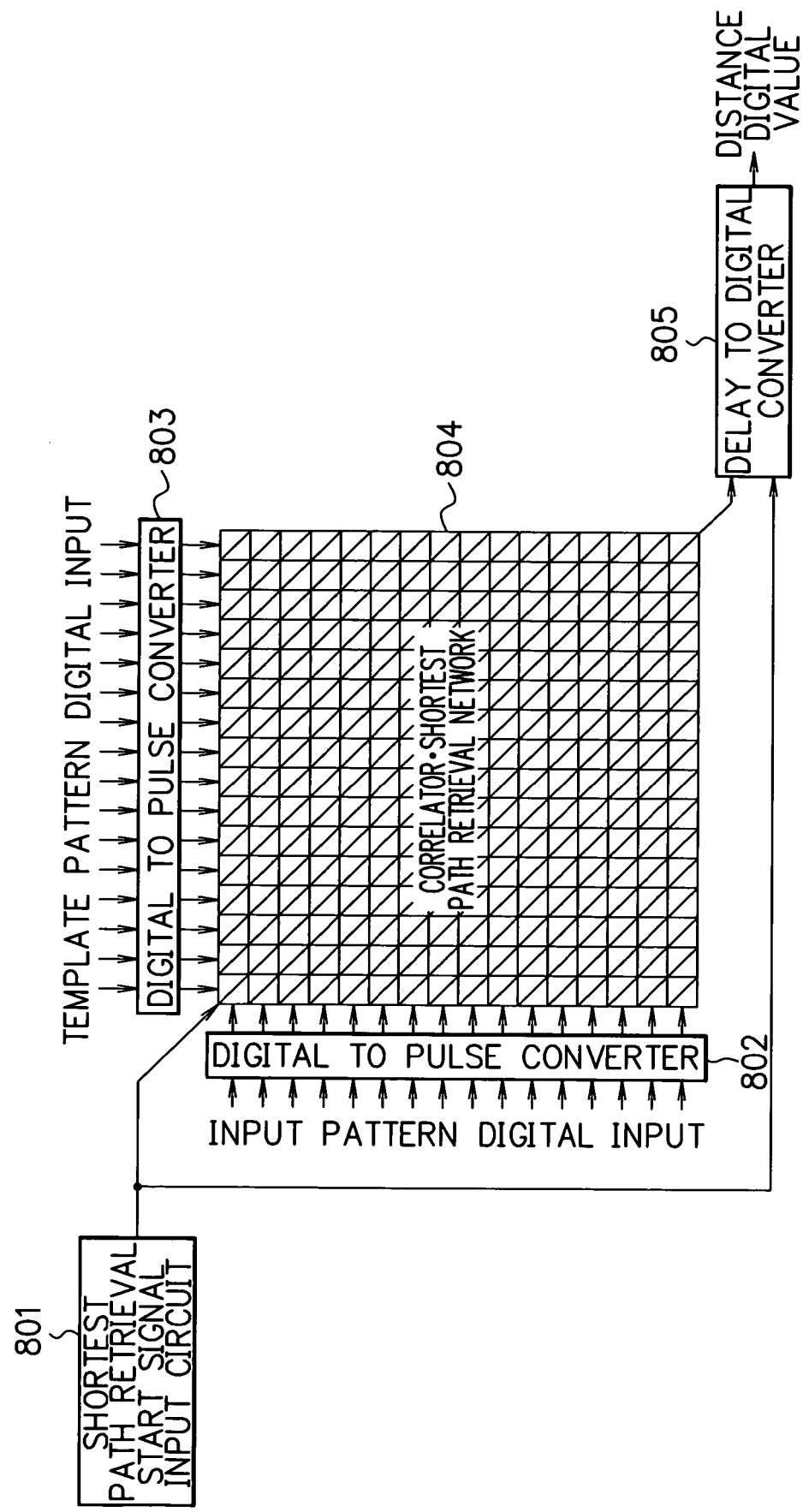
FIG. 8 is a diagram showing a shortest path detecting semiconductor circuit for performing DP matching according to another embodiment of the present invention.

FIG. 8 shows a shortest path detecting semiconductor circuit for performing DP matching according to another embodiment of the present invention. A digital to pulse converter 802 converts a digital input of an input pattern to a predetermined pulse and supplies the pulse to each square of a lattice network 804. A digital to pulse converter 803 converts a digital input of a template pattern to a predetermined pulse and supplies the pulse to each square of the lattice network 804. The lattice network 804 includes a correlator and a shortest path retrieving circuit. A shortest path retrieval start signal input circuit 801 inputs a shortest path retrieval start signal to a start node of the lattice network 804. The network 804 propagates the start signal inputted to the start node and outputs it from a goal node. A delay to digital converter 805 performs conversion to a distance digital value based on a delay time between the start signal inputted to the start node and an output signal outputted from the goal node. This distance digital value corresponds to the degree of dissimilarity between the input pattern and the template pattern.

Figure 9:
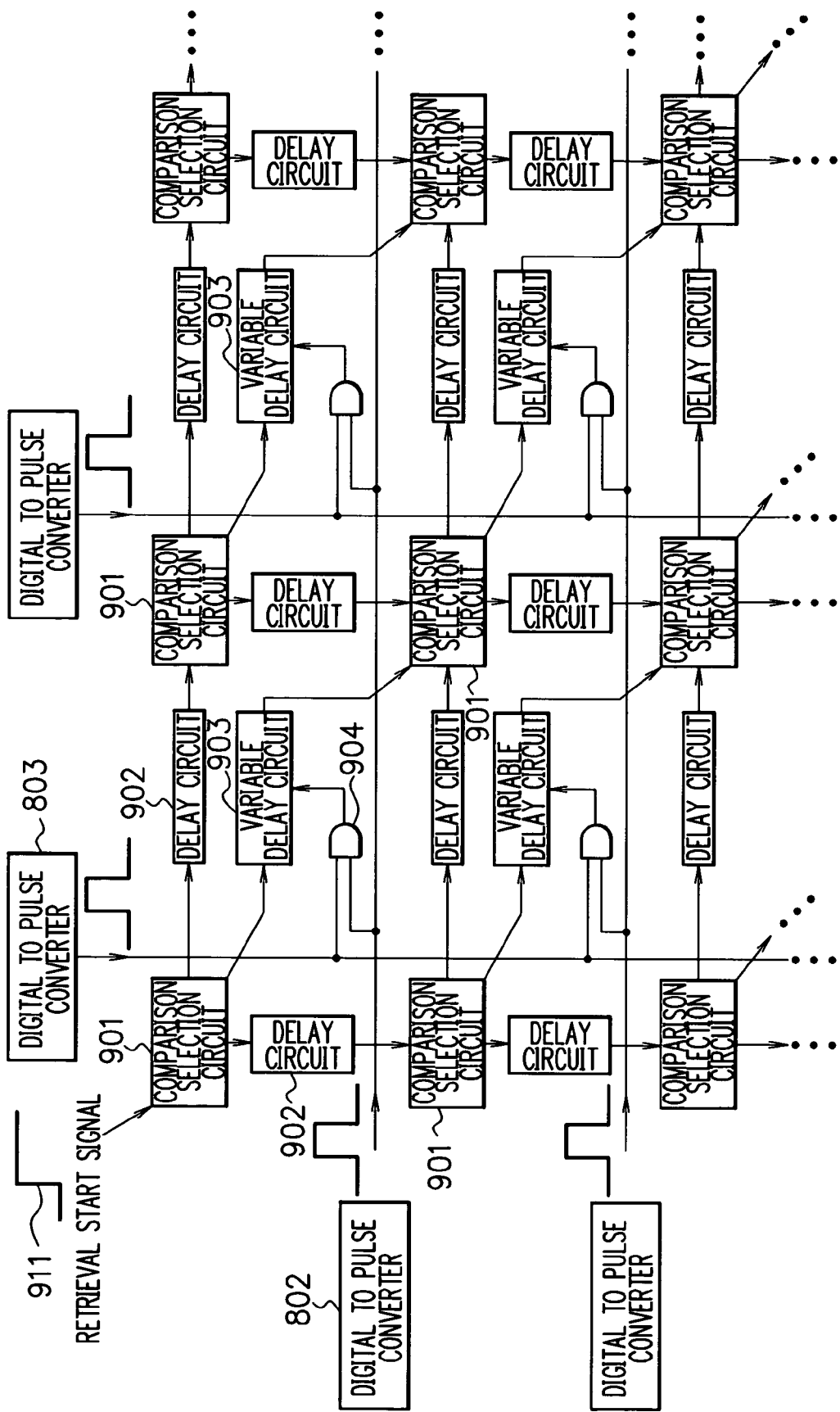
FIG. 9 is a diagram showing a specific circuit example of a lattice network.

FIG. 9 shows a specific circuit example of the lattice network 804 in FIG. 8. A comparison selection circuit 901 corresponds to the node circuit 401 in FIG. 4. A delay circuit 902 corresponds to the delay circuit 402 in FIG. 4. A variable delay circuit 903 corresponds to the variable delay circuit 403 in FIG. 4. A retrieval start signal 911 is inputted to the comparison selection circuit 901 at an upper left start node.

When the retrieval start signal 911 changes from low to high, the retrieval of the shortest path is started. The digital to pulse converters 802 and 803 each output a predetermined pulse. Concerning these pulses, their pulse positions are determined according to respective vector element values of multidimensional vector data, and their pulse widths are, for example, a fixed value. A detailed explanation thereof will be given later. An AND circuit 904 computes and outputs a logical product of a pulse of the input pattern outputted by the digital to pulse converter 802 and a pulse of the template pattern outputted by the digital to pulse converter 803. Namely, the AND circuit 904 outputs a high level only while both the pulses are high, and outputs a low level at all other times. The pulse width of the output of the AND circuit 904 corresponds to similarity (correlation value). The variable delay circuit 903 delays an output signal of the upper left comparison selection circuit 901 and outputs it to the lower right comparison selection circuit 901. More specifically, the variable delay circuit 903 outputs a signal with a shorter delay time as the pulse width of the output of the AND circuit 904 increases.

Figure 10:
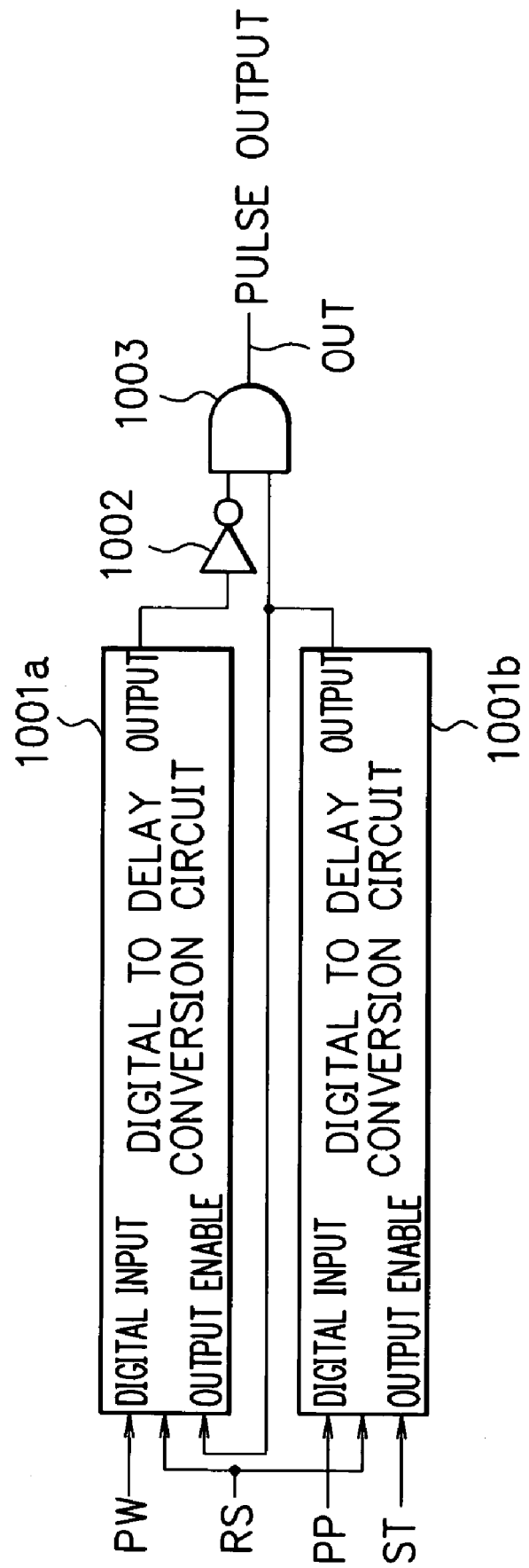
FIG. 10 is a diagram showing a configuration example of a digital to pulse converter.
Figure 11:
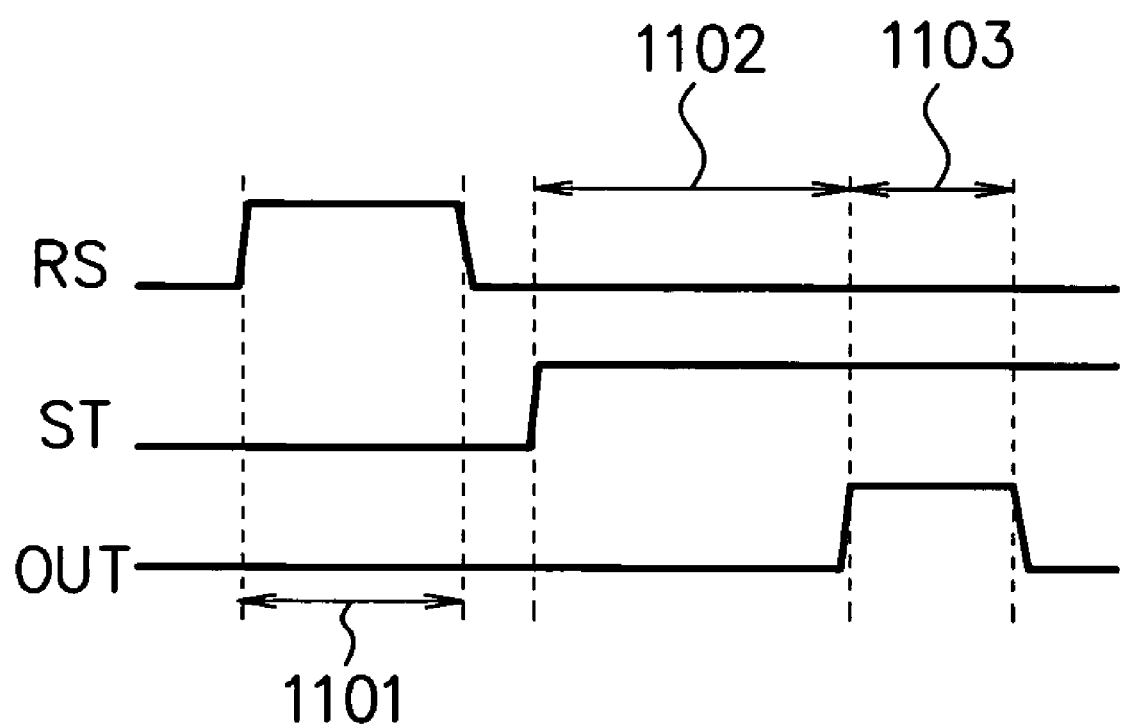
FIG. 11 is a timing chart showing a circuit operation in FIG. 10.

FIG. 10 shows a configuration example of the digital to pulse converters 802 and 803 in FIG. 8 and FIG. 9, and FIG. 11 is a timing chart showing the circuit operation thereof. A reset signal RS becomes high only during a reset period 1101. A conversion start signal ST goes high after the reset period 1101 to indicate the start of conversion. In a pulse output signal OUT, a pulse which goes high in a pulse position 1102 after the conversion start signal ST becomes high is generated. This pulse has a pulse width 1103. For example, the pulse position 1102 is determined by a numerical value of the vertical axis in FIG. 2B, and the pulse width 1103 shows a correlation range. A detailed explanation thereof will be given later with reference to FIG. 15.

Digital to delay conversion circuits 1001a and 1001b have the same configuration, to which the reset signal RS is inputted. The specific configuration of the circuits 1001a and 1001b will be explained later with reference to FIG. 12. In the digital to delay conversion circuit 1001b, a pulse position digital value PP is inputted to a digital input terminal, and the conversion start signal ST is inputted to an output enable terminal. The pulse position digital value PP corresponds to the pulse position 1102 in FIG. 11. In the digital to delay conversion circuit 1001a, a pulse width digital value PW is inputted to a digital input terminal, and an output of the digital to delay conversion circuit 1001b is inputted to an output enable terminal. The pulse width digital value PW corresponds to the pulse width 1103 in FIG. 11. An inverter 1002 outputs a logical negation signal of an output signal of the digital to delay conversion circuit 1001a. An AND circuit 1003 computes a logical product of an output signal of the digital to delay conversion circuit 1001b and the output signal of the inverter 1002 and outputs it as a pulse output signal OUT.

Figure 12:
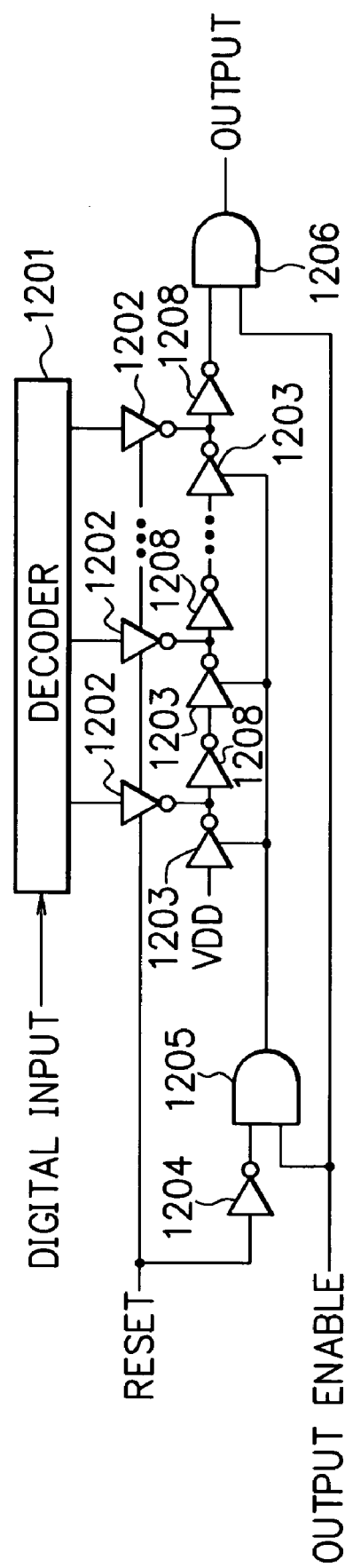
FIG. 12 is a diagram showing a configuration example of a digital to delay conversion circuit.

FIG. 12 shows a configuration example of the digital to delay conversion circuits 1001a and 1001b. A decoder 1201 generates $2^N$ of output signals with respect to an N-bit digital input signal. More specifically, only one output is driven high and the other outputs are driven low by the digital input value.

In each of tri-state inverters 1202 and 1203, an output is brought to a high impedance state when a control terminal is low, and in the high impedance state, the output maintains its immediately preceding level. Moreover, when the control terminal is high, each of the tri-state inverters 1202 and 1203 logically negates an input and outputs it.

An inverter 1204 outputs a logical negation signal of the reset signal RS. An AND circuit 1205 computes and outputs a logical product of an output signal of the inverter 1204 and an output enable signal. An output signal of the AND circuit 1205 is supplied to the control terminal of each of the tri-state inverters 1203, and the reset signal RS is supplied to the control terminal of each of the tri-state inverters 1202.

The outputs of the decoder 1201 are outputted to output lines of the tri-state inverters 1203 via the tri-state inverters 1202 for reset. When the reset signal RS goes high, logical negations of the outputs of the decoder 1201 are reset respectively as initial values of the output terminals of the tri-state inverters 1203. Namely, the initial value of the only one output terminal is reset low, and the initial values of all the other output terminals are reset high. An AND circuit 1206 computes a logical product of a last-stage output signal of inverters 1208 and the output enable signal and outputs it as an output signal from an output terminal.

Figure 13:
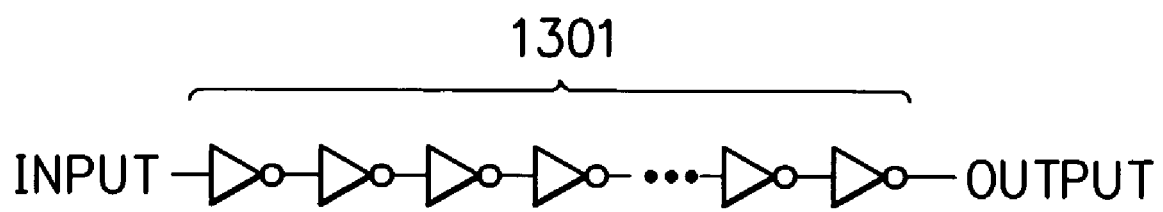
FIG. 13 is a diagram showing a configuration example of a delay circuit.

FIG. 13 shows a configuration example of the delay circuit 902 in FIG. 9. The delay circuit 902 can be configured by connecting even-numbered stage inverters 1301 in series.

Figure 14:
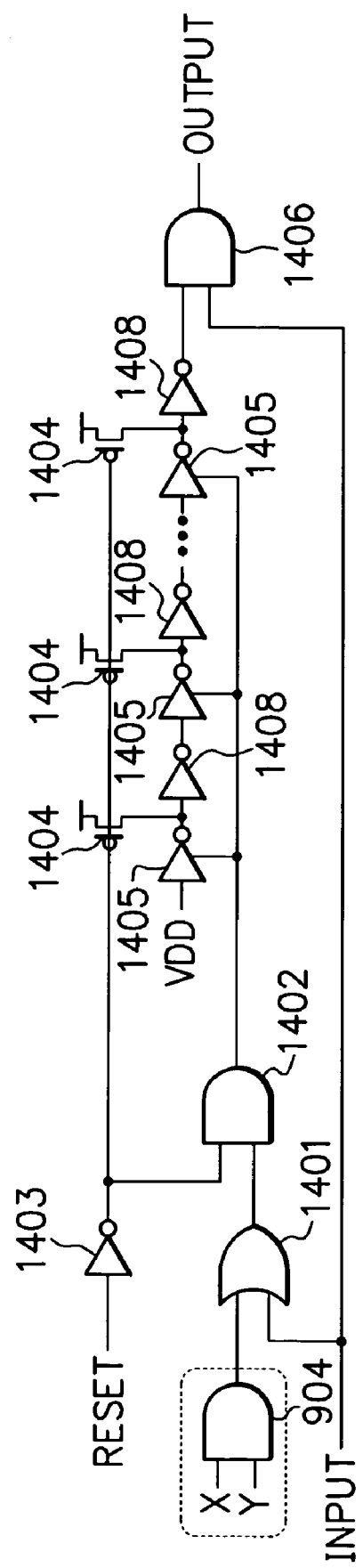
FIG. 14 is a diagram showing a configuration example of a variable delay circuit.
Figure 15:
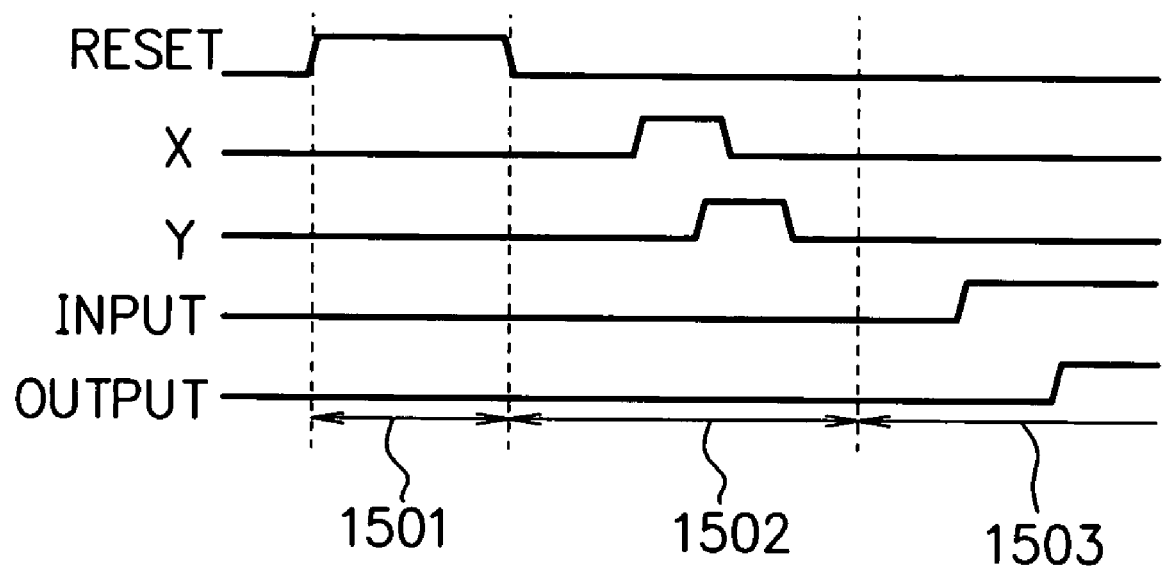
FIG. 15 is a timing chart showing a circuit operation in FIG. 14.

FIG. 14 shows a configuration example of the variable delay circuit 903 in FIG. 9, and FIG. 15 is a timing chart showing the circuit operation thereof. An inverter 1403 outputs a logical negation signal of a reset signal. Gates of plural p-channel MOS transistors 1404 are connected to an output of the inverter 1403, sources thereof are connected to power source potentials, and drains thereof are connected to respective output terminals of tri-state inverters 1405. An AND circuit 904 corresponds to a correlator and is equivalent to the AND circuit 904 in FIG. 9. In the AND circuit 904, one input is represented as a signal X, and the other input is represented as a signal Y. A logical sum (OR) circuit 1401 computes and outputs a logical sum of an input signal and an output signal of the AND circuit 904. An AND circuit 1402 computes a logical product of an output signal of the inverter 1403 and an output signal of the OR circuit 1401 and outputs it to control terminals of the tri-state inverters 1405. An AND circuit 1406 computes and outputs a logical product of the input signal and a last-stage output signal of inverters 1408.

In FIG. 15, during a reset period, a reset signal is high. Then, in a correlation computation period 1502, pulses of the signal X and the signal Y are generated. Then, in a distance evaluation period 1503, the input signal and an output signal are generated. The output signal is a signal obtained by adding a delay time to the input signal according to the degree of correlation between the signal X and the signal Y.

It is assumed that the pulse position of the pulse of the signal X is, for example, a voice data numerical value of 15 and the pulse width thereof is 5. It is assumed that the pulse position of the pulse of the signal Y is, for example, a voice data numerical value of 19 and the pulse width thereof is 5. As a result, the overlap between the pulses of the signal X and the signal Y is 1, and hence the correlation value (the degree of similarity) between the signal X and the signal Y is 1. For example, if both the signal X and the signal Y are in the pulse position of a voice data numerical value of 15, the correlation value indicating a overlap between both the pulses is 5. By computing a logical product of the signal X and the signal Y by the AND circuit (correlator) 904, the correlation value (degree of dissimilarity) which corresponds to an absolute value |X-Y| of a difference between a numerical value of the signal X and a numerical value of the signal Y.

In the reset period 1501, when the reset signal goes high, outputs of the tri-state inverters 1405 are set high. Immediately after reset, this situation is maintained. Then, in the correlation computation period 1502, while the pulses of the signal X and the signal Y coincide, a high level is supplied to each of the control terminals of the tri-state inverters 1405. Thereafter, in the distance evaluation period 1503, the output signal is outputted in a predetermined delay time after the input signal is propagated. As the period during which the pulses of the signal X and the signal Y coincide becomes longer, the output signal with a shorter delay time is outputted.

Figure 16:
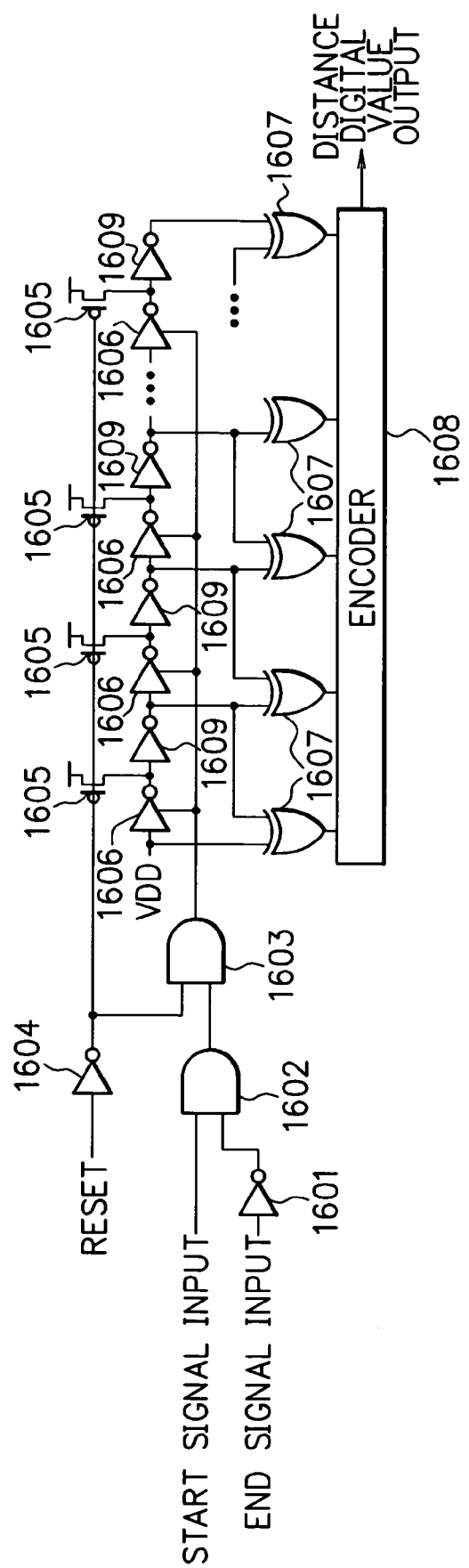
FIG. 16 is a diagram showing a configuration example of a delay to digital converter.

FIG. 16 shows a configuration example of the delay to digital converter 805 in FIG. 8. An inverter 1604 outputs a logical negation signal of a reset signal. Gates of plural p-channel MOS transistors 1605 are connected to an output of the inverter 1604, sources thereof are connected to power source potentials, and drains thereof are connected to respective output terminals of tri-state inverters 1606. An inverter 1601 outputs a logical negation signal of an end signal. An AND circuit 1602 computes and outputs a logical product of a start signal and the output signal of the inverter 1601. An AND circuit 1603 computes the output of the inverter 1604 and the output of the AND circuit 1602 and outputs it to control terminals of the tri-state inverters 1606. Each of exclusive logical sum (XOR) circuits 1607 computes and outputs an exclusive logical sum of signals of input terminals of two tri-state inverters 1606. The XOR circuit 1607 outputs a low level when the two input signals are the same and outputs a high level when they are different. An encoder 1608 performs encoding based on output signals of the XOR circuits 1607 and outputs a distance digital value.

This delay to digital conversion circuit is based on the principle of operation reverse to the digital to delay conversion circuit in FIG. 12. First, by driving the reset signal high, the respective output terminals of the tri-state inverters 1606 of a delay chain are reset high. Then, propagation through a chain of the inverters 1606 and 1609 is performed only during a delay time from when the start signal goes high until the end signal goes high, and when the end signal goes high, the propagation stops. Thereafter, a boundary between the output terminals of the tri-state inverters 1606 which go low and high is detected by the XOR circuits 1607. The encoder 1608 converts the position of the boundary to a digital value and outputs it as a distance digital value. The distance digital value corresponds to the degree of dissimilarity between the input pattern and the template pattern.

As described above, DP matching can find the degree of similarity between the input pattern INP and the template pattern TEM as in FIG. 2B. In this case, the correlator is only required to compute an absolute value |Xi-Yi| of a difference between an input pattern Xi and a template pattern Yi as the degree of dissimilarity and control the delay time in multiple stages. For example, the more similar both the patterns, the wider the pulse width is made, so that the variable delay circuit is controlled. The DP matching can perform various kinds of matching of image data and so on in addition to character strings and voice data.

Moreover, on the occasion of the computation of a correlation value in the shortest path retrieving network, the computation may be performed by a digital logical operation, and the digital to delay conversion circuit in FIG. 12 or the like can be used in place of the variable delay circuit in FIG. 14.

Further, it is also possible to store only the correlation value in a memory instead of providing an arithmetic circuit in the network and control the variable delay circuit according to the correlation value of the memory. In this case, the digital to delay conversion circuit or the like can be used in place of the variable delay circuit.

Furthermore, in the above description, the delay time is made shorter in the case of a high similarity degree or a coincidence, but, contrary to this, the delay time may be made longer. In this case, a longest path is required to be retrieved instead of the shortest path. The time required from when the input signal is inputted to the start node until it arrives at a goal node last is measured. This time corresponds to the degree of similarity of the most similar comparison combination. Each node is required to store a path of a signal which has arrived last.

As described above, according to this embodiment, three or more nodes at least including one input node (start node) and one output node (goal node), plural paths which are connected between the three or more nodes and whose signal propagation directions between the nodes are regulated, and a signal propagation time regulator for regulating a signal propagation time of each of the paths are provided. The time required for a predetermined signal to be inputted to the input node, propagate through the paths, and arrive at the output node is detected. The degree of coincidence or the degree of similarity between two signals to be subjected to matching can be detected according to the time required.

The node, when there are plural signals inputted to the node via paths connected to the node itself, specifies and stores a path of a signal which arrives first or last out of the signals inputted via the paths connected to the node itself. By specifying the path, a shortest path or a longest path corresponding to the aforementioned degree of coincidence or degree of similarity can be detected.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As explained above, according to the present invention, it is possible to regulate a signal propagation time of each of paths and detect the time required for an input signal to propagate through the paths and arrive at an output node. If the signal propagation time of each path is regulated according to the degree of coincidence or the degree of similarity between two signals to be subjected to matching, the degree of coincidence or the degree of similarity between the two signals can be detected according to the time required to arrive at the output node. Moreover, if a shortest path or a longest path of the signal is detected, a comparison combination of the shortest path or the longest path corresponding to the degree of coincidence or the degree of similarity can be detected.

What is claimed is:

1. A semiconductor circuit, comprising:
three or more nodes at least including one input node and one output node;
plural paths connected between said three or more nodes and whose signal propagation directions between the nodes are regulated;
signal propagation time delay circuits for establishing a signal propagation delay time for each of said paths;
an input unit coupled to said one input node for inputting an input signal to the input node;
a detector coupled to said input node for determining a time required for the input signal to propagate through said paths and arrive at the output node; and
wherein each of said node nodes comprises a storage unit for, when there are plural signals inputted to said node via paths connected to said node itself, specifying and storing a path of a signal which arrives first or last out of the signals inputted via the paths connected to said node itself.

2. The semiconductor circuit according to claim 1, wherein when three signals are inputted to each of said nodes via three paths, said storage unit of said node comprises three three-input negative logical product circuits to each of which one each of the three signals inputted via the three paths is inputted, and further inputted to said each of the negative logical product circuits are outputs of the other two negative logical product circuits.

3. The semiconductor circuit according to claim 1, wherein said signal propagation time delay circuits for at least one path out of said plural paths changes the signal propagation time according to a degree of coincidence or a degree of similarity between two signals to be subjected to matching.

4. The semiconductor circuit according to claim 3, wherein said nodes are arranged in a two-dimensional lattice shape.

5. The semiconductor circuit according to claim 4, wherein by determining the degree of coincidence or the degree of similarity between the two signals to be subjected to matching according to the determined time required to arrive at the output node and specifying a path stored in said storage unit, said detector determines a shortest path or a longest path corresponding to the degree of coincidence or the degree of similarity to perform dynamic programming matching.

6. The semiconductor circuit according to claim 5, wherein when three signals are inputted to said node via three paths, said storage unit of said node comprises three three-input negative logical product circuits to each of which one each of the three signals inputted via the three paths is inputted, and further inputted to said each of the negative logical product circuits are outputs of the other two negative logical product circuits.

7. The semiconductor circuit according to claim 5, further comprising a converter for converting element values of the two signals to be subjected to matching to pulses having pulse positions according to the element values.

8. The semiconductor circuit according to claim 5, wherein said delay circuit comprises an even number of inverters.

9. The semiconductor circuit according to claim 8, wherein said delay circuit is a variable delay circuit.

10. The semiconductor circuit according to claim 5, wherein the two signals to be subjected to matching are character data.

11. The semiconductor circuit according to claim 5, wherein the two signals to be subjected to matching are voice data.

12. The semiconductor circuit according to claim 5, wherein the two signals to be subjected to matching are image data.

13. The semiconductor circuit according to claim 1, wherein by determining a degree of coincidence or a degree of similarity between two signals to be subjected to matching according to the determined time required to arrive at the output node and specifying a path stored in said storage, said detector determines a shortest path or a longest path corresponding to the degree of coincidence or the degree of similarity to perform dynamic programming matching.

14. A semiconductor circuit, comprising:

three or more nodes at least including one input node and one output node;

plural paths connected between said three or more nodes and whose signal propagation directions between the nodes are regulated;

signal propagation time delay circuits for establishing a signal propagation delay time for each of said paths;

an input unit coupled to said one input node for inputting an input signal to the input node;

a detector coupled to said input node for determining a time required for the input signal to propagate through said paths and arrive at the output node; and wherein said signal propagation time delay circuits for at least one path out of said plural paths changes the signal propagation time according to a degree of coincidence or a degree of similarity between two signals to be subjected to matching.

15. A semiconductor circuit, comprising:

three or more nodes at least including one input node and one output node; wherein said nodes are arranged in a two-dimensional lattice shape;

plural paths connected between said three or more nodes and whose signal propagation directions between the nodes are regulated;

signal propagation time delay circuits for establishing a signal propagation delay time for each of said paths;

an input unit coupled to said one input node for inputting an input signal to the input node; and a detector coupled to said input node for determining a time required for the input signal to propagate through said paths and arrive at the output node.

* * * * *